(12) United States Patent
Lucas

(10) Patent No.: US 9,523,367 B2
(45) Date of Patent: Dec. 20, 2016

(54) CANTILEVER FAN

(75) Inventor: Timothy S. Lucas, Providence Forge, VA (US)

(73) Assignee: Aavid Thermalloy, LLC, Laconia, NH (US)

( * ) Notice: Subject to any disclaimer, the term of this patent is extended or adjusted under 35 U.S.C. 154(b) by 771 days.

(21) Appl. No.: 13/818,513

(22) PCT Filed: Aug. 19, 2011

(86) PCT No.: PCT/US2011/048394
§ 371 (c)(1),
(2), (4) Date: Mar. 22, 2013

(87) PCT Pub. No.: WO2012/027215
PCT Pub. Date: Mar. 1, 2012

(65) Prior Publication Data
US 2013/0183154 A1    Jul. 18, 2013

Related U.S. Application Data

(60) Provisional application No. 61/376,858, filed on Aug. 25, 2010.

(51) Int. Cl.
| | |
|---|---|
| *F04D 19/00* | (2006.01) |
| *H01L 41/083* | (2006.01) |
| *G01P 15/09* | (2006.01) |
| *H01L 41/09* | (2006.01) |
| *F04D 33/00* | (2006.01) |

(52) U.S. Cl.
CPC ............ *F04D 19/002* (2013.01); *F04D 33/00* (2013.01); *G01P 15/0922* (2013.01); *H01L 41/083* (2013.01); *H01L 41/094* (2013.01)

(58) Field of Classification Search
CPC ...... F04D 19/002; F04D 33/00; H01L 41/094; H01L 41/083; G01P 15/0922
See application file for complete search history.

(56) References Cited

U.S. PATENT DOCUMENTS

| | | |
|---|---|---|
| 5,758,823 A | 6/1998 | Glezer et al. |
| 5,894,990 A | 4/1999 | Glezer et al. |
| 5,966,286 A | 10/1999 | O'Connor et al. |
| 5,988,522 A | 11/1999 | Glezer et al. |
| 6,123,145 A | 9/2000 | Glezer et al. |
| 6,588,497 B1 | 7/2003 | Glezer et al. |

(Continued)

FOREIGN PATENT DOCUMENTS

| | | |
|---|---|---|
| CN | 1265777 A | 9/2000 |
| CN | 201037478 Y | 3/2008 |

(Continued)

OTHER PUBLICATIONS

Office Action dated Mar. 19, 2015 for corresponding Chinese Application No. 201180047955.7.
(Continued)

*Primary Examiner* — Kenneth Bomberg
*Assistant Examiner* — Brandon Lee
(74) *Attorney, Agent, or Firm* — Wolf, Greenfield & Sacks, P.C.

(57) ABSTRACT

A cantilever fan including a cantilever blade that is clamped at one end. The fan includes an actuator that applies a periodic force to the blade resulting in periodic deflections of the blade.

13 Claims, 12 Drawing Sheets

(56) References Cited

U.S. PATENT DOCUMENTS

| | | | |
|---|---|---|---|
| 7,252,140 | B2 | 8/2007 | Glezer et al. |
| 7,485,991 | B2 | 2/2009 | Kim et al. |
| 7,606,029 | B2 | 10/2009 | Mahalingam et al. |
| 7,607,470 | B2 | 10/2009 | Glezer et al. |
| 7,760,499 | B1 | 7/2010 | Darbin et al. |
| 7,768,779 | B2 | 8/2010 | Heffington et al. |
| 7,784,972 | B2 | 8/2010 | Heffington et al. |
| 7,819,556 | B2 | 10/2010 | Heffington et al. |
| 7,932,535 | B2 | 4/2011 | Mahalingam et al. |
| 8,030,886 | B2 | 10/2011 | Mahalingam et al. |
| 8,035,966 | B2 | 10/2011 | Reichenbach et al. |
| 8,066,410 | B2 | 11/2011 | Booth et al. |
| 8,069,910 | B2 | 12/2011 | Beltran |
| 8,136,576 | B2 | 3/2012 | Grimm |
| 8,272,851 | B2 | 9/2012 | Lucas |
| 8,290,724 | B2 | 10/2012 | Darbin et al. |
| 8,299,691 | B2 | 10/2012 | Grimm |
| 8,388,142 | B2 | 3/2013 | Jones et al. |
| 8,430,644 | B2 | 4/2013 | Mahalingam et al. |
| 8,579,476 | B2 | 11/2013 | Mahalingam et al. |
| 8,646,701 | B2 | 2/2014 | Grimm et al. |
| 8,672,648 | B2 | 3/2014 | Glezer et al. |
| 8,770,765 | B2 | 7/2014 | Jones et al. |
| 8,772,987 | B2 | 7/2014 | Grimm et al. |
| 8,777,456 | B2 | 7/2014 | Mahalingam et al. |
| 8,845,138 | B2 | 9/2014 | Booth et al. |
| 2006/0138875 | A1 | 6/2006 | Kim et al. |
| 2008/0286133 | A1 | 11/2008 | He et al. |
| 2011/0014069 | A1* | 1/2011 | Wada ............ F04D 33/00 417/410.2 |

FOREIGN PATENT DOCUMENTS

| | | |
|---|---|---|
| CN | 101153617 A | 4/2008 |
| CN | 101199062 A | 6/2008 |
| CN | 101372988 A | 2/2009 |
| JP | H1-131898 | 9/1989 |
| JP | H3-35298 | 4/1991 |
| JP | 2005-005896 | 6/2003 |
| JP | 2005-133555 A | 5/2005 |
| JP | 2010-029759 | 7/2008 |
| JP | 2010-029759 A | 2/2010 |
| WO | WO 2009119431 A1 | 10/2009 |

OTHER PUBLICATIONS

International Search Report PCT/US2011/048394 dated Mar. 22, 2012.

Office Action dated Jun. 25, 2015 for corresponding Japanese Application No. 2013-526039.

* cited by examiner

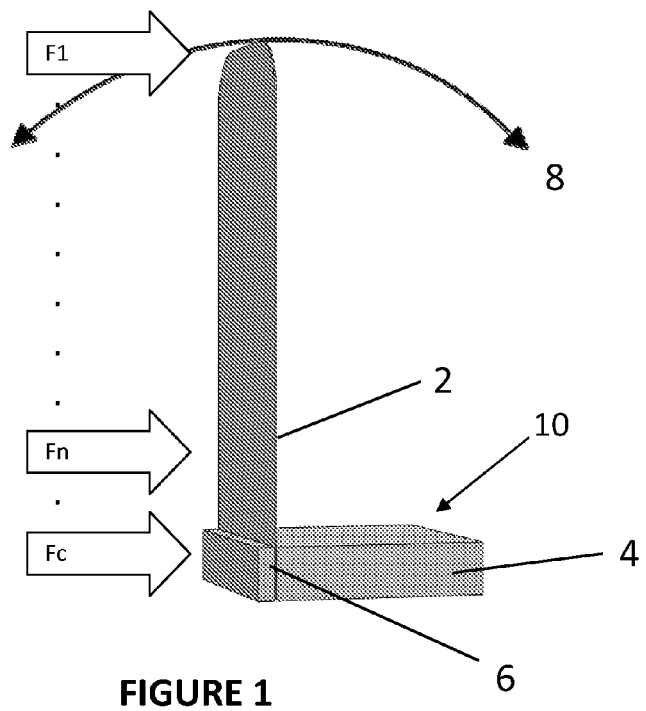
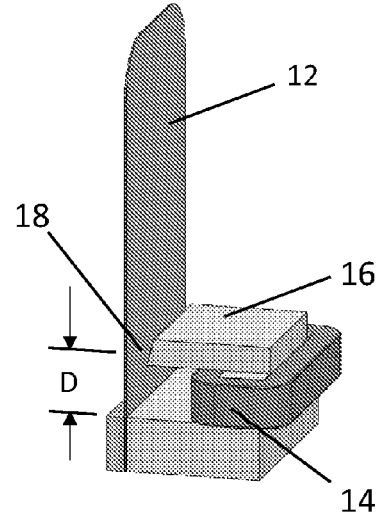
FIGURE 1
FIGURE 2
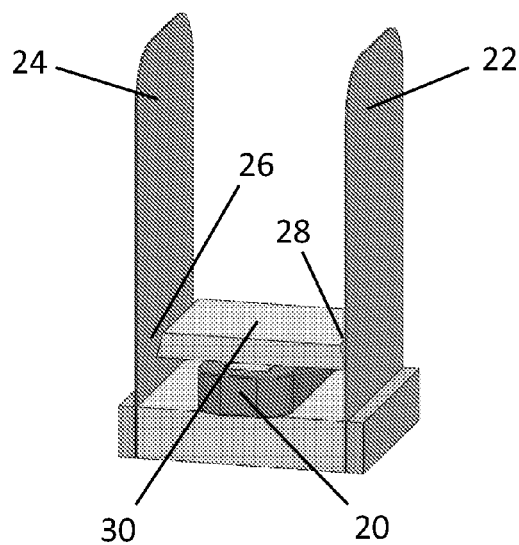
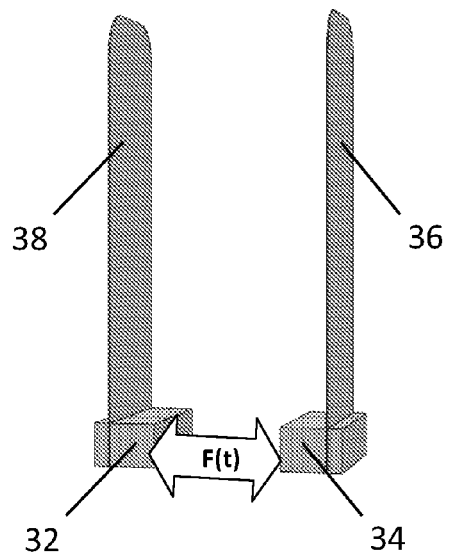
FIGURE 3
FIGURE 4

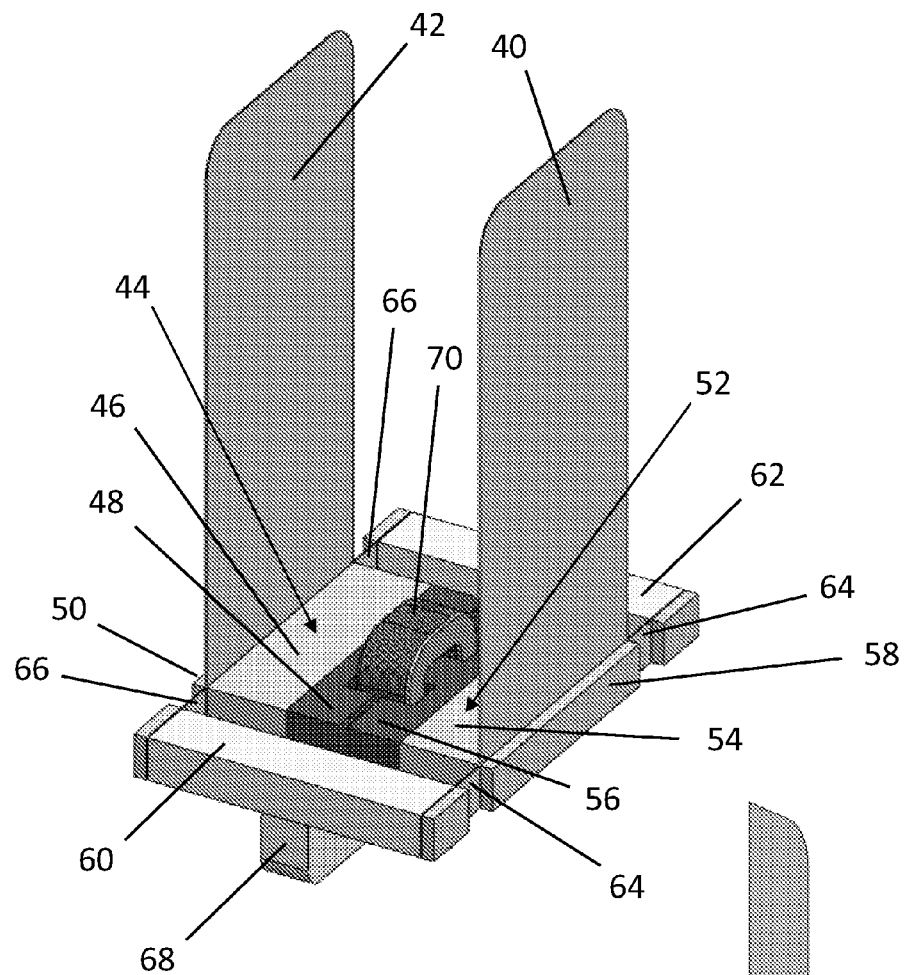
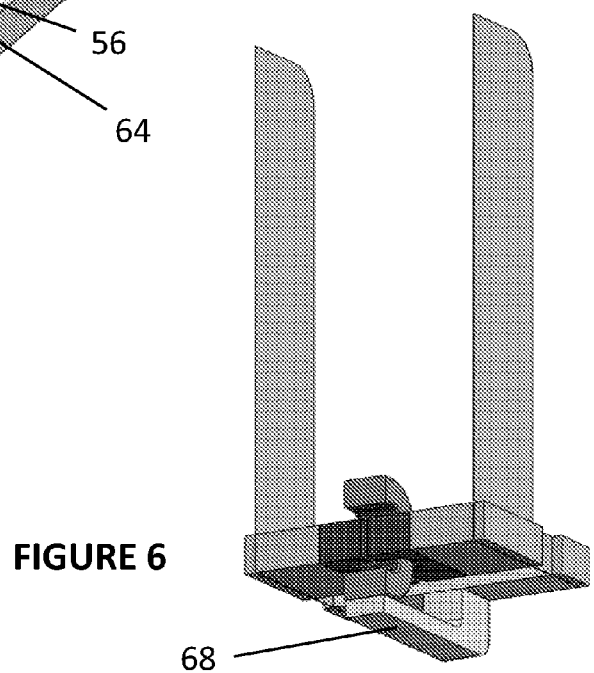
FIGURE 5
FIGURE 6

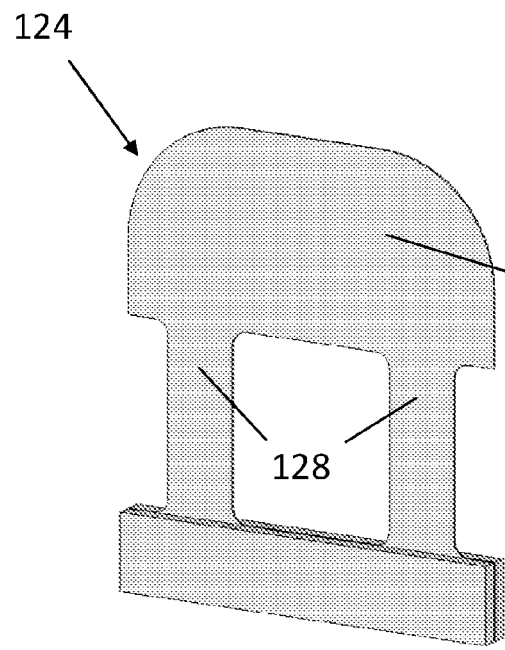
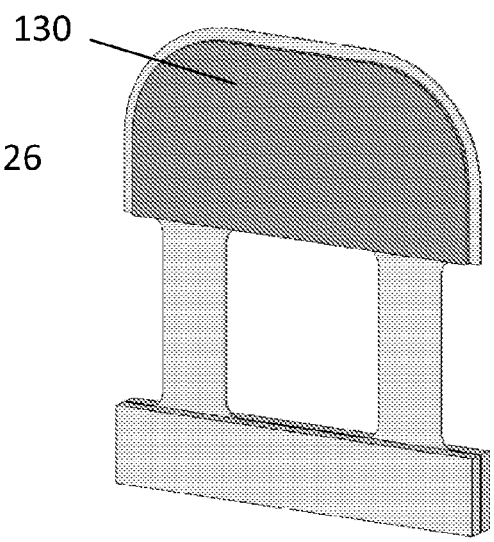
FIGURE 13 | FIGURE 14
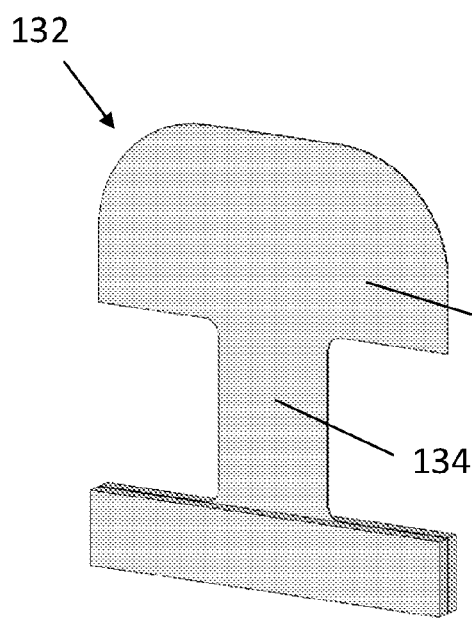
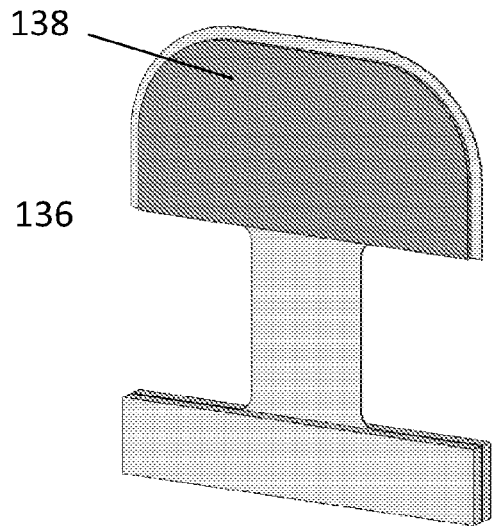
FIGURE 15 | FIGURE 16

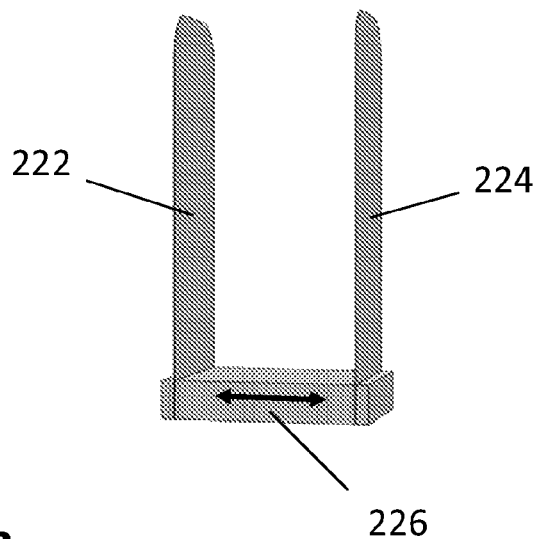
FIGURE 22
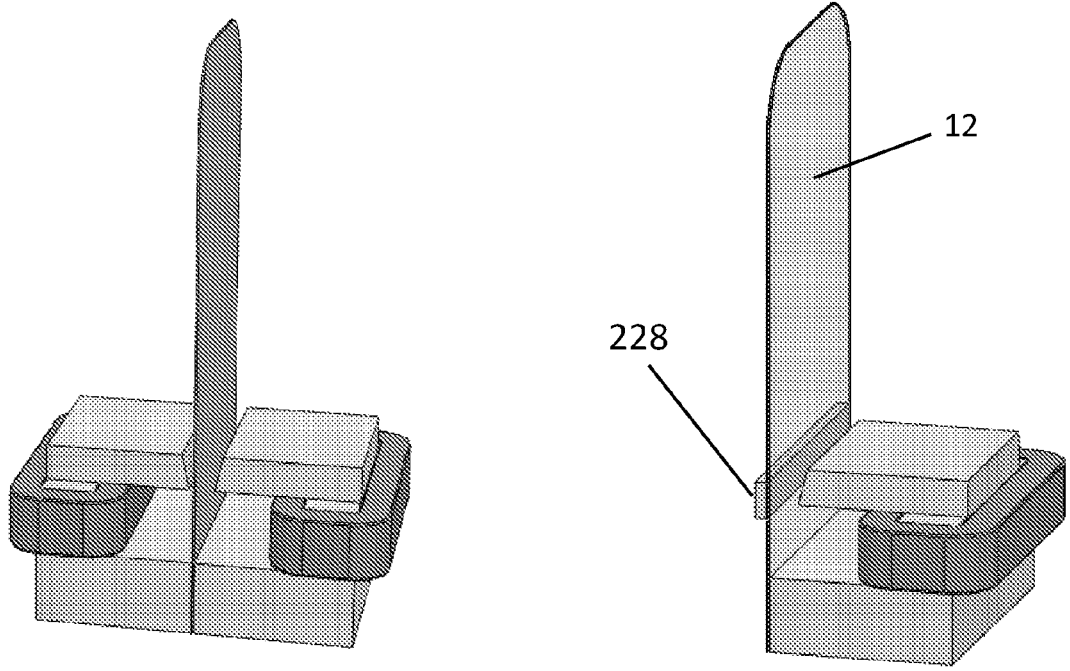
FIGURE 23 FIGURE 24

CANTILEVER FAN

BACKGROUND

This application relates generally to fan technology for the purpose of moving air and more specifically for the purpose of moving air for applications in thermal management and mixing applications.

Rotary fans to move air for heat transfer applications are the ubiquitous cooling solution in electronics thermal management. Increased power density in electronic products places demands on rotary fan technology to improve air flow rates, reduce size, increase life, lower noise and vibration and reduce power consumption. From this list of conflicting demands, the most challenging appears to be long life. Emerging products such as HBLED lighting can require fan life times of up to 10 years but the bearings used in rotary fans typically provide no more than 3 years of continuous use.

Cantilever fans have the advantage of eliminating the bearings which are typically the life-limiting component of rotary fans. Despite this advantage, cantilever fans fall short on many of the other industry requirements and, thus, have seen little commercialization during the three decades devoted to their development. For example, conventional cantilever fans cannot provide air flow rates comparable to rotary fans in a small form factor due to the large length-to-width ratio required for cantilever blade stability and quiet operation.

Also, it appears that nearly all cantilever fan development has focused on piezo laminations as the form of blade actuation and these materials, such as PZT, contain lead. There are a number of disadvantages associated with using materials that include lead such as the manufacturing health and safety risks and related permit and compliance issues, which contribute to the high cost of PZT materials. Furthermore, products that contain hazardous materials such as lead are less likely to be accepted by customers than alternative products containing no hazardous materials.

In addition, laminated PZT actuators require high voltages for their operation. These high voltages are objectionable to most product OEMs. Multiple laminations can be used to reduce the voltage requirements, but these laminations result in higher manufacturing complexity and cost. Multiple laminations require very high manufacturing tolerances if double cantilevers are used to cancel vibration, because the resonance frequency of each blade must be closely matched. Each lamination layer includes very thinly cut PZT and an adhesive layer. As a result, the precision required to manufacture matching blades increases with the product of the number of layers and increases the high cost of laminated piezo actuators.

A further disadvantage of piezo materials is that their transduction properties change over time resulting in reduced performance and loss of the dual blade matching required to provide low vibration cantilever fans. Transduction properties will also change with the aging of the lamination adhesive layers, resulting in the same loss of performance and vibration issues.

The above disadvantages have prevented cantilever fans from being responsive to the industry's need for new innovative fan technology that can provide cost-effective performance and extended life.

BRIEF DESCRIPTION OF THE DRAWINGS

The accompanying drawings, which are incorporated in and form a part of the specification, illustrate the various disclosed embodiments and, together with the description, serve to explain the principles of the invention. In the drawings:

FIG. 1 illustrates force application principles for a cantilever blade in accordance with an embodiment of the present invention;

FIG. 2 provides a specific blade-driven embodiment;

FIG. 3 illustrates a double blade embodiment for reducing fan vibrations;

FIG. 4 provides a schematic representation of a clamp-driven embodiment;

FIG. 5 illustrates a clamp-driven embodiment;

FIG. 6 is a sectional view of the embodiment of FIG. 5;

FIG. 13 illustrates a cantilever blade embodiment;
FIG. 14 illustrates a cantilever blade embodiment;
FIG. 15 illustrates a cantilever blade embodiment;
FIG. 16 illustrates a cantilever blade embodiment;
FIG. 22 illustrates an electrostrictive actuator embodiment;
FIG. 23 illustrates a blade-driven push-pull electromagnetic actuator;
FIG. 24 shows one of many possible actuator improvements to increase actuator force.

DETAILED DESCRIPTION

Figure 7:
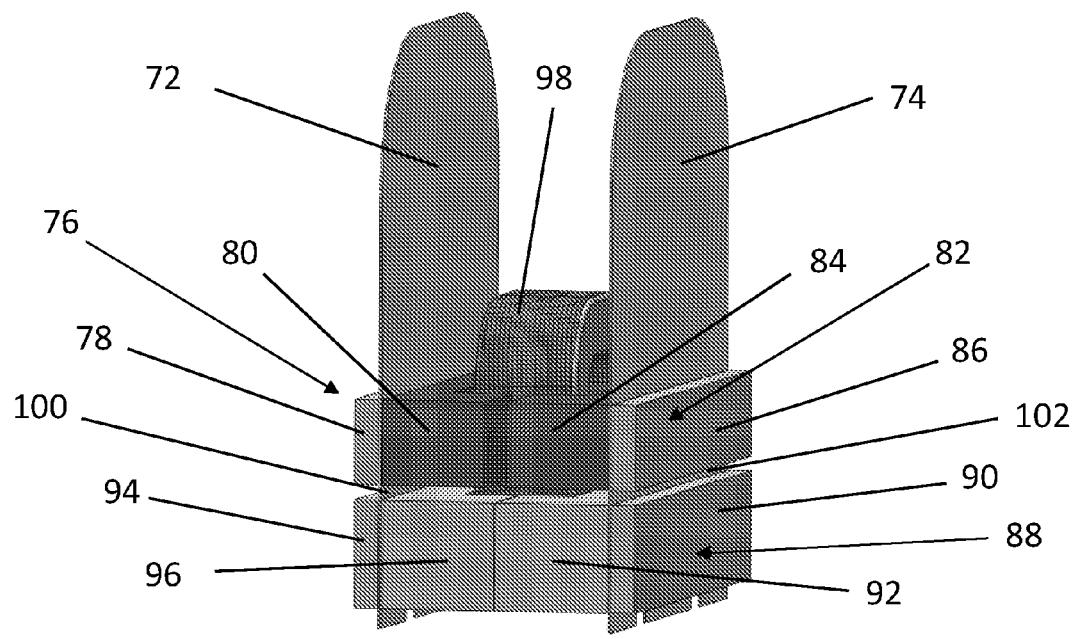
FIG. 7 provides another clamp-driven embodiment.

To satisfy industry needs and overcome the limitations of previous efforts, the present application discloses a cantilever fan having a new means of blade actuation that overcomes the limitations of piezo laminate actuators, thereby providing a high-performance and cost effective fan technology for use in thermal management and other air-moving applications. To further satisfy these needs and overcome the limitations of previous efforts, the new means of actuation enables the use of practical and reliable actuators for powering cantilever fans; solves the fan life problem; enables high flow rates in small fan form factors; enables low noise by operating at low frequencies with near sinusoidal blade motions due to the high resonance quality factor ("Q"); provides low vibration and reduces the size/form-factor of cantilever fans to make them practical for electronics cooling (real space-constrained high-power products).

FIG. 1 provides a schematic representation of the range of locations that actuation forces may be applied to a cantilever fan. The cantilever fan of FIG. 1 has a cantilever blade 2 (hereinafter referred to as a "blade") and a clamp mass 10 comprising clamp base 4 and clamp plate 6. Blade 2 is rigidly clamped between clamp plate 6 and clamp base 4 with clamp base 4 being stationary for a classic cantilever and with the opposite end of blade 2 being free to oscillate in the desired fundamental cantilever mode as illustrated by arc 8. There are two general locations to which actuation forces may be applied: (1) directly to any point along the length of the blade, which is referred to as blade driving; and (2) directly to the mass that clamps the blade, which is referred to a clamp-driving. In both cases, the fan includes an actuator for providing actuation forces that are periodic and have a frequency appropriate to at least partially excite the desired fundamental cantilever mode. In general, the preferred cantilever mode would provide for the widest arc of oscillation (see arc 8 of FIG. 1) for a given input power level. As known to those skilled in the art, the best performance and efficiency will be provided for drive frequencies that are equal to or close to the frequency of the desired cantilever mode, but in the desired cantilever mode the blade may also be excited with frequencies that are harmonics and sub-harmonics of the desired mode and all these drive frequencies are considered within the scope of the present invention.

Blade Driving

Blade actuation forces may be applied directly to the blade anywhere from the tip of the blade as illustrated in FIG. 1 by force F1 to very near the blade clamp line and also to any intermediate location between the blade tip and blade clamp line as illustrated by force Fn. This continuum of force application points corresponds to a continuum of load impedances as seen by the actuator which is applying the force, with the tip of the blade being the lowest impedance point and points near the blade clamp line having the highest impedance. The exact values of the blade's impedance at various points along its length will be a function of the particular blade design. The wide range of load impedances along the length of the blade suggests different actuator styles and topologies for applying actuator forces at a given point. When applying forces to the blade, it is assumed that clamp mass 10 is primarily stationary relative to the blade's tip displacement.

Actuator subcomponents used for blade-driven embodiments, can be categorized as either stationary or oscillating. The force that actuates the blades is generated between the stationary and oscillating components. The stationary components are positioned so as to not oscillate with the blade and in that sense to be substantially stationary with respect to the blade's oscillating motion. The term stationary as used herein does not mean that the actuator is absolutely stationary as it may have some vibration as result of blade reaction forces. But the actuator component will be nearly stationary with respect to the clamped end of the blade, since it will not be connected to the blade but will instead be connected to the stationary or non-oscillating components of the fan. The oscillating components will be attached to the blade and so will oscillate with the blade. For example, in the embodiment of FIG. 3 armature 30 is a stationary actuator component and blades 22 and 24 serve as the oscillating actuator components. As a further example, in FIG. 24 the armature is a stationary actuator component and blade 12 and backing plate 228 are the oscillating actuator components.

Actuator designs both stationary and oscillating components are distinctly different from the laminate piezo bender actuators used in prior art devices that are bonded to the cantilever blade and do not have any actuator components that are stationary with respect to the blade's oscillation. The actuators having components that do not oscillate with the blade, enable many of the advantages of the disclosed cantilever fan.

FIG. 2 illustrates one such blade-driven embodiment where an electromagnetic force is applied to the blade at a distance D from the clamp line of blade 12. The actuator comprises a coil 14 wound around an armature 16, being stationary with respect to the blade's oscillation. An air gap 18 is located between armature 16 and blade 12. When the coil is energized, the resulting attractive electromagnetic force in air gap 18 pulls the blade towards armature 16. A number of different voltage waveforms may be used to drive coil 14 but, in general, the frequency of the waveform will be appropriate to excite the fundamental cantilever mode in the blade and provide the performance required by a given application. If a sinusoidal drive voltage is used, the force response is parametric so that the drive voltage frequency must be one half of the resonant frequency of the blade. If any uni-polar pulsed voltage waveform is used, peak efficiency will typically be found for duty cycles that are less than 50%.

FIG. 3 illustrates a dual blade cantilever fan with each blade being driven by the same actuator topology as blade 12 of FIG. 2. When coil 20 is energized the respective electromagnetic forces in air gaps 26 and 28 will pull blades 22 and 24 towards armature 30. In this way, the periodic actuator forces excite the preferred cantilever mode of blades 22 and 24 such that the blades move in opposition to each other resulting in the cancellation of their transverse reaction forces. This force cancellation reduces the vibration of armature 30 thereby reducing the vibration transmitted to the product or system to which the fan is mounted.

The actuators shown in FIGS. 2 and 3 are located proximate to the clamped end of the fan blade. The scope of the present invention includes providing actuating forces at any point along the length of the blade. For example, in FIG. 2, the distance D could be increased or decreased and the exact value of D may be chosen in response to specific design requirements. For example, for some design requirements, the actuating forces may be applied at the blade tip. The actuator may be mounted to a portion of the fan housing located opposite to the clamp base. In such an embodiment, the arrangement of the housing would permit for oscillation of the blades and air flow out of the fan while still providing structural support for the actuator and clamp base. Similarly, the actuators may be mounted at other points along the length of the blade in order to apply actuation forces to the blade at locations between the blade tip and clamped end.

Clamp-Driving

As illustrated by force Fc in FIG. 1, a periodic force may be applied to clamp mass 10 to create a periodic oscillation of clamp mass 10 as a means of exciting the preferred cantilever mode of blade 2. When driving the blade in this mode, the blade's tip displacement may be hundreds of times higher than the displacement of clamp mass 10. Consequently, only very small displacements of the clamp mass are required to drive large blade tip deflections. In general, the actuator must provide enough force to power the blade's oscillation and to oscillate the mass of the clamp structure.

FIG. 4 is a schematic representation depicting the clamp-mass driving approach to a dual blade cantilever fan whereby a periodic actuator force F(t) is applied between clamp masses 32 and 34 of respective blades 38 and 36. In this way the cantilever modes of blades 38 and 36 are excited so that blades 38 and 36 move in opposition to each other resulting in the cancellation of their transverse reaction forces.

FIG. 5 illustrates an embodiment of the clamp driving approach illustrated schematically in FIG. 4. Blades 40 and 42 are clamped by respective clamp masses 52 and 44. Clamp mass 52 comprises a clamp base 54, clamp plate 58 and an E-shaped armature 56. Clamp mass 44 comprises a clamp base 46, clamp plate 50 and an E-shaped armature 48. Actuator springs 66 and 64 resiliently connect respective clamp masses 44 and 52 to spring brackets 60 and 62. Actuator springs 66 and 64 may be either an integral part of the blade or a separate part to provide a spring material thickness different from the blade thickness. Spring brackets 60 and 62 are rigidly connected to each other by coil support 68 which also supports stationary coil 70 as shown in the sectional view of FIG. 6. In operation, a periodic current waveform is provided to coil 70 at the desired resonant frequency of blades 40 and 42, which results in a periodic attractive force between armatures 48 and 56 which in turn results in clamp masses 44 and 52 oscillating on springs 66 and 64 in opposition to each other. The oscillation of clamp masses 44 and 52 in turn excites the desired cantilever mode of blades 42 and 40. The stiffness of springs 66 and 64 will be chosen such that the energy stored in them during the application of the magnetic force will push the armatures apart again in a time period appropriate for the operating frequency. To operate primarily in a clamp driven mode where the displacement ratio of blade tip to clamp mass is very high, springs 66 and 64 should be stiff enough to permit only small displacements of clamp masses 44 and 52. The opposed transverse vibrations of clamp masses 44 and 52 and blades 42 and 40 will result in cancellation of the respective reaction forces resulting in reduced vibration transmitted to the product or system to which the fan is mounted. Spring brackets 60 and 62 and coil support 68 are the components with the least vibration and so provide the best mounting points for the fan. As shown by arc 8 of FIG. 1, the oscillation of the blades also have an axial component which will transmit axial reaction forces to the fan clamp base. These axial reaction forces may result in some vibration of brackets 60 and 62 and coil support 68 in the fan of FIG. 5. Resilient mounting may be provided to isolate this vibration from the product or system to which the fan is mounted.

Figure 8:
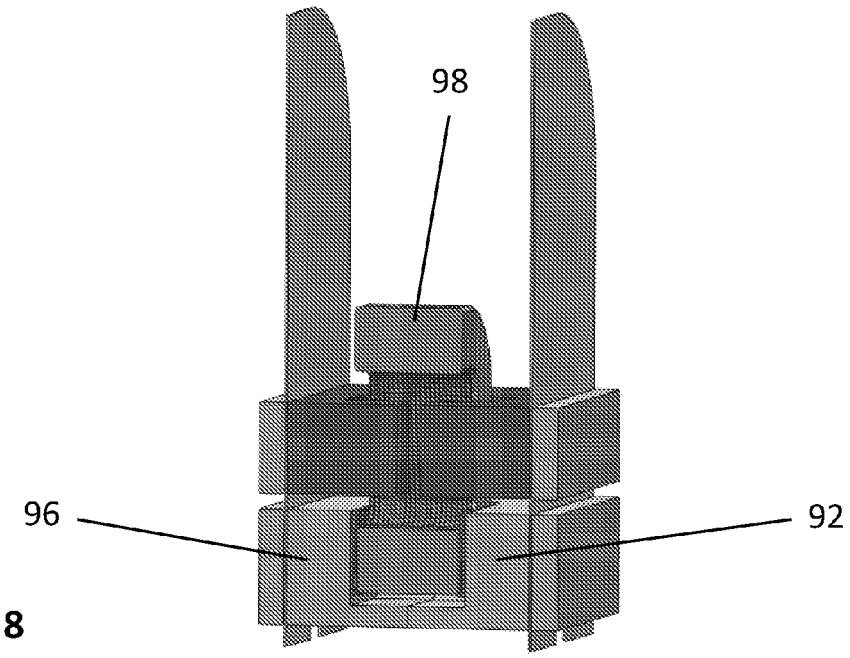
FIG. 8 is a sectional view of the embodiment of FIG. 7.

FIG. 7 illustrates another clamp driven embodiment. Blades 72 and 74 are clamped by respective clamp masses 76 and 82. Clamp mass 76 comprises a clamp plate 78 and an E-shaped armature 80. Clamp mass 82 comprises a clamp plate 86 and an E-shaped armature 84. Blades 72 and 74 extend through clamp masses 76 and 82 and into fan base 88. Fan base 88 comprises clamp plates 94 and 90 and coil clamps 92 and 96 which clamp stationary coil 98 as shown in the sectional view of FIG. 8. The actuator springs may be integrated into the blades. For example, the sections of blades 72 and 74 that span between their respective clamp masses 76 and 82 to fan base 88 may serve as respective actuator springs 100 and 102 and perform the same function as springs 66 and 64 of FIG. 5. In operation, a periodic current waveform is provided to coil 98 at the desired resonant frequency of blades 72 and 74 resulting in a periodic attractive force between armatures 80 and 84 which in turn results in clamp masses 76 and 82 oscillating on springs 100 and 102 in opposition to each other. The oscillation of clamp masses 76 and 82 in turn excite the desired cantilever mode of blades 72 and 74. The stiffness of springs 100 and 102 will be chosen such that the energy stored in them, during the application of the magnetic force, will push the armatures apart again in a time period appropriate for the operating frequency. To operate primarily in a clamp driven mode where the displacement ratio of blade tip to clamp mass is very high, springs 100 and 102 should be stiff enough to permit only small displacements of clamp masses 76 and 82. The opposed transverse vibrations of clamp masses 76 and 82 and blades 72 and 74 will result in cancellation of the respective reaction forces resulting in reduced vibration transmitted to the product or system to which the fan is mounted. Fan base 88 is the component with the least vibration and so provides the best mounting point for the fan. As illustrated by arc 8 of FIG. 1, the oscillation of blades 72 and 74 have an axial component which will transmit axial reaction forces to the fan clamp base. These axial reaction forces may result in some vibration of fan base 88. Resilient mounting may be used to isolate this vibration from the product or system to which the fan is mounted.

Flow and Pressure

Prior art cantilever fans are able to create air flow but only at pressures that are very low compared to rotary fans of similar size. This poor pressure performance is due in part to a low resistance to the backflow of air through the cantilever fan. Placing a housing around a cantilever fan will improve its pressure performance. However, the housing does not address the primary problem. The primary reason for this comparatively poor pressure performance is that the reverse flow path through a cantilever fan is unrestricted except during the fraction of the oscillation period when the fan blade is passing through a particular point on its displacement arc. In other words, the dwell time of the blade at a particular point, when it is actually moving air forward at that point, is only a small fraction of the total blade oscillation period. During the remainder of the oscillation period there is less resistance to back flow of air through the cantilever fan as a result of a down stream flow resistance.

Figure 9:
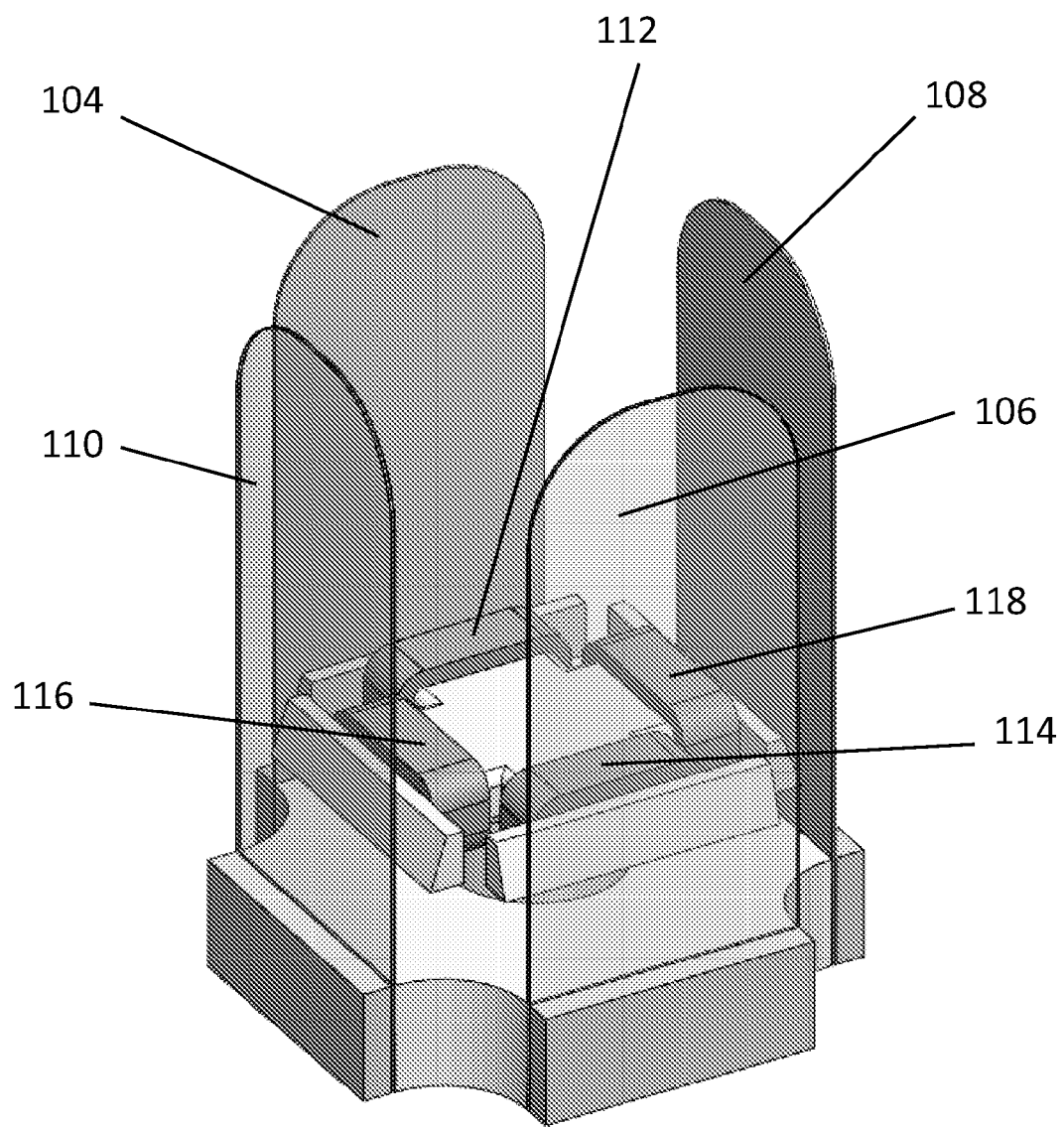
FIG. 9 illustrates another blade-driven embodiment having two pairs of cantilever blades that share the same displacement space and provide improved pressure performance.

The embodiment shown in FIG. 9 is an example of how the flow and pressure performance of cantilever fans may be improved by adding a second set of cantilever fan blades. The manner in which the actuators excite the cantilever modes of blades 104, 106, 108 and 110 in FIG. 9 is identical with the fans of FIGS. 2 and 3. In operation, a first periodic current waveform drives both coils 112 and 114 and a second periodic current waveform drives coils 116 and 118 with the first and second current waveforms being 180° or nearly 180° out of phase with each other. This phasing of the coil currents will result in blades 104 and 106, comprising a first pair of blades, to oscillate in opposition to each other and blades 108 and 110, comprising a second pair of blades, to also oscillating in opposition to each other. The phasing of the coil currents also results in the first pair of blades being out of phase with the second pair of blades such that when the blade tips of the first blade pair are closest to each other then the blade tips of the second pair are the farthest from each other. In this way, the two pairs of blades all swing through the same space without colliding resulting in longer blade dwell times and reduced air back flow in the presence of downstream flow resistance.

Figure 10:
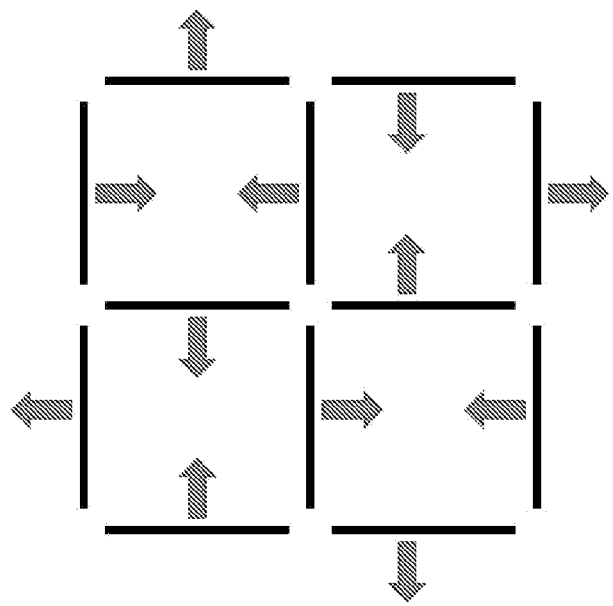
FIG. 10 provides a top-view schematic representation of an array of cantilever blades that share the same displacement space and provide improved pressure performance.

This method of shared blade deflection space and the above described advantages may be extended to any number blades arranged in an array. An exemplary embodiment of a fan including an array of blades is schematically illustrated in FIG. 10, which shows an instantaneous top view of the blades (i.e. looking down the plane of the blades) at the instant when each blade is passing through its equilibrium point in the direction shown by the arrows. Any number of different actuation schemes could be used for the individual blades of a fan array. Perforations or ports could be added to the base of the blades in the array to allow air flow through the array. This approach may be used to provide a cantilever fan array having an overall aspect ratio similar to a pancake type rotary fan. Other arrays may also be used where cantilever blades of like phase are grouped together in sections where displacement space is not shared.

Flow vs. Fan Size

Prior art cantilever fans are much larger than rotary fans providing the same air flow rate, making them impractical for typical thermal management applications. Cantilever blades are the size determining component of prior art cantilever fans. However, meeting industry requirements for performance, size and noise creates conflicting demands that prior art cantilever fans cannot overcome to provide size reductions and form factors that are more compatible with real products that use fans.

The air flow rate produced by a cantilever fan is proportional to blade size (how much air the blade can displace), blade frequency, blade stroke and blade tip velocity. Increasing the blade width will provide more flow for a given length blade, but the increased blade width leads to more noise due to blade instabilities. Quiet operation requires low operating frequencies and sinusoidal oscillations with no higher mechanical blade harmonics. The generation of sinusoidal oscillations requires large separation between the oscillation frequencies for the blade's fundamental cantilever mode and its higher modes. In prior art fans, this separation has traditionally been achieved by designing rectangular blades with a high length to width (L/W) ratio for good mode separation, which prevents making the blade wider for more flow. Also, to achieve low frequency operation for low noise, the blades length must be increased, which increases the size of the fan without necessarily increasing flow rate. These conflicting requirements result in prior art cantilever fans that are much larger than rotary fans for the same flow rate.

Blade Shapes and Mass Distribution

The disclosed provides a means to improve performance and reduce cantilever fan size with new blade geometries and blade mass distribution together which (1) enable very low L/W aspect ratios, (2) provide high air flow performance due to these wider blades and (3) low-frequency sinusoidal displacements despite the low L/W ratios resulting in quiet operation.

Figure 11:
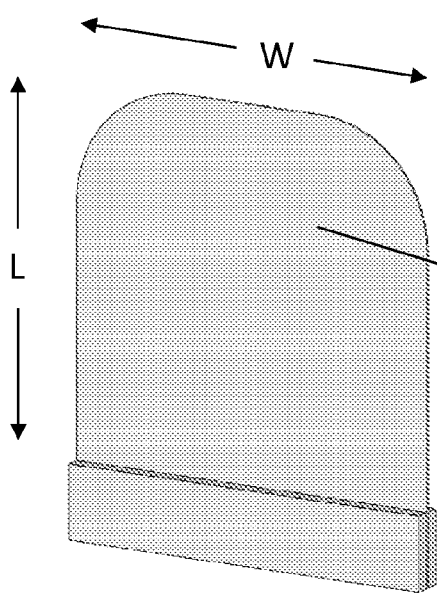
FIG. 11 shows a cantilever blade with a small length to width (L/W) ratio which would tend to be unstable and noisy.

Fan blade 120 shown in FIG. 11 has a L/W ratio of approximately 1 and will have a dense model spectrum at frequencies near the preferred cantilever mode. Consequently, driving the cantilever mode to displacements large enough to create useful air flow will also excite these other modes resulting in audible noise levels with the sound quality resembling a buzzer which is very objectionable for most thermal management applications. For fan sizes required for practical thermal management, fan blade 120 will also have a fundamental cantilever frequency that's too high for quiet operation.

Figure 12:
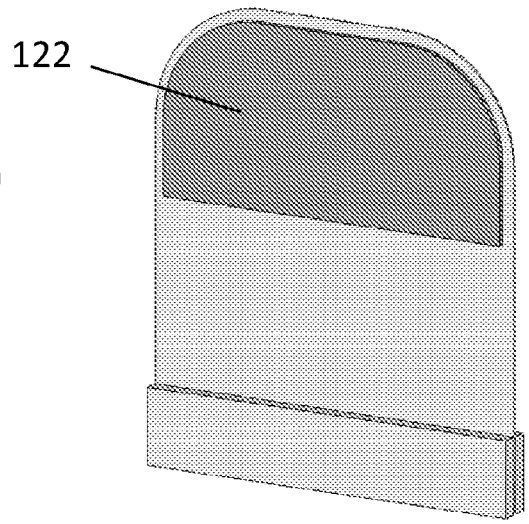
FIG. 12 illustrates a cantilever blade embodiment.

Fan blade 120 of FIG. 11 is shown in FIG. 12 with a mass 122 bonded to the tip end of the blade. Adding this type of mass provides the following advantages. Mass 122 stiffens a large part of the blade's area which eliminates some of the undesirable modes and raises the frequency of other undesirable modes resulting in sinusoidal motion at the fundamental cantilever mode. Mass 122 also lowers the fundamental cantilever frequency thereby enabling very short blades to operate at low frequencies. The addition of mass 122 also increases the stored energy in the blade resonance which reduces the power needed to drive the blade to large deflections resulting in higher energy efficiency and also increase the fluid work that may be done by the blade resulting in higher pressure performance. Mass loaded blades such as shown in FIGS. 12, 14, 16 and 18 have the same advantages as described above and may maintain stable quiet operation at peak-to-peak tip deflections that are greater than the blade's length, thereby enabling significant air flow from a very compact cantilever blade.

The preferred mass distribution may also be provided without the addition of a separate mass on the blade. For example, FIG. 13 illustrates another blade embodiment that provides sinusoidal displacement by eliminating modes and increasing the frequency of other modes. A blade 124 comprises a paddle 126 and two legs 128 where legs 128 are the principal bending members and paddle 124 provides the primary fluidic work. Relative to legs 128 paddle 126 provides some mass loading properties since it has a larger mass than legs 128. The configuration of the blade provides for an improved mass distribution.

Also, desired mass distribution may be accomplished by combining the use of a separate mass in conjunction with a preferred blade geometry. For example, FIG. 14 shows blade 124 of FIG. 13 with a mass 130 bonded to paddle 126. Mass 130 will reduce the resonant frequency as well as increase the blade's Q thereby increasing the fan's efficiency.

FIG. 15 depicts another blade embodiment that allows for sinusoidal displacement by eliminating modes and increasing the frequency of other modes. A blade 132 comprises a paddle 136 and a leg 134 where leg 134 is the principal bending member and paddle 136 provides the primary fluidic work. Relative to leg 134, paddle 136 provides some mass loading properties since it has a larger mass than leg 134.

FIG. 16 shows blade 132 of FIG. 15 with a mass 138 bonded to paddle 132. Mass 138 will reduce the resonant frequency as well as increase the blade's Q thereby increasing the fan's efficiency.

Figure 17:
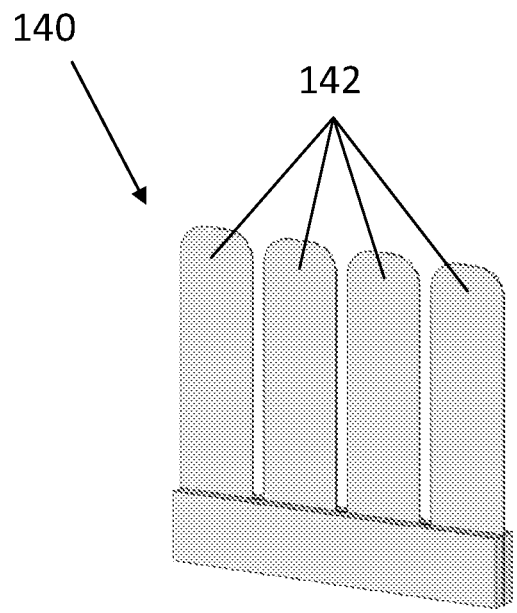
FIG. 17 illustrates a cantilever blade embodiment.

FIG. 17 illustrates another blade embodiment that provides sinusoidal displacement by eliminating modes and increasing the frequency of other modes. In FIG. 17 a blade 140 is subdivided into four individual blades 142 all having the same cantilever resonance frequency. Individual blades 142 provide a high L/W ratio which creates stable sinusoidal oscillations of each individual blade, while all four blades fit into the low L/W ratio footprint.

Figure 18:
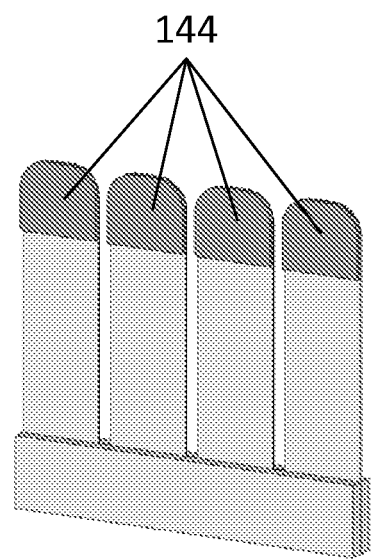
FIG. 18 illustrates a cantilever blade embodiment.

FIG. 18 shows blade 140 of FIG. 17 with identical masses 144 bonded to individual blades 142. Masses 144 will reduce the resonant frequency of blades 142 an equal amount as well as increase the Q of blades 142 an equal amount, thereby increasing the fan's efficiency.

There are many fabrication methods for the blades of FIGS. 12-18 that will be apparent to those who are skilled in the art and are considered within the scope of the present invention. For example, paddles could be separate discrete components that are bonded to the spring legs or could be over molded to the spring legs using injection molding methods. Blade masses may be discrete components made of any number of materials or could be integral to the paddles or could be a property of the paddles themselves simply by varying the thickness of the paddles.

Blade-Driven Radial Fan

Figure 19:
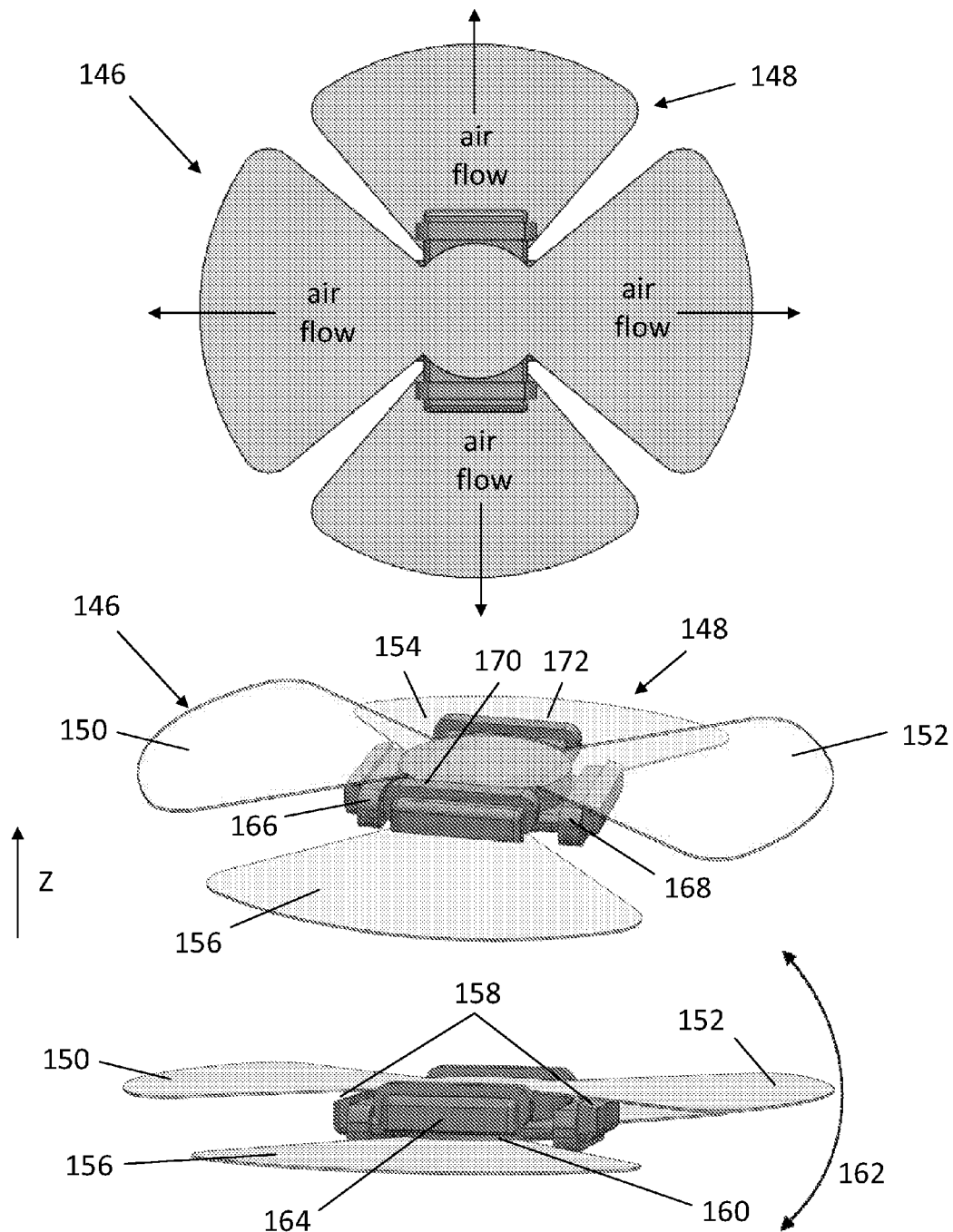
FIG. 19 illustrates a blade-driven radial fan embodiment.

FIG. 19 illustrates another embodiment that provides radially directed air flow and enhanced vibration cancellation. In FIG. 19, blade 146 includes paddles 150 and 152 and blade 148 has paddles 154 and 156 with blade 146 being rotated 90° from blade 148. The center of blade 146 is rigidly bonded to the top center surface of magnetic core body 164 and the center of blade 148 is rigidly bonded to the bottom center surface of magnetic core body 164. Blades 146 and 148 are actuated in the same manner and with the same style of actuator as the fans of FIGS. 2, 3 and 9. Paddles 150 and 152 are actuated by the magnetic forces created in symmetric air gaps 158 when coils 166 and 168 are energized and paddles 154 and 156 are actuated by the magnetic forces in symmetric air gaps 160 when coils 170 and 172 are energized (second air gap 160 is not visible in the views shown). In operation, the paddles of blades 146 and 148 oscillate in the Z direction which creates air flow principally in a radial direction. In the preferred embodiment for vibration cancellation, coils 166 and 168 are driven with the same periodic current causing paddles 150 and 152 to oscillate in phase with each other and coils 170 and 172 are driven with the same periodic current causing paddles 154 and 156 oscillate in phase with each other and the current waveform driving coils 166 and 168 is in phase with the current waveform driving coils 170 and 172 causing the paddles of blade 146 to oscillate in opposition to (180° out of phase with) the paddles of blade 148.

In FIG. 19, each paddle tip oscillates with an arc similar to arc 162 and, as a result, each blade creates both radial and Z axial reaction forces that act upon the magnetic core body 164. Magnetic core body 164 is the point at which the fan of FIG. 19 would be mounted to a product. Due to the symmetry of the fan blades, the radial reaction forces of each paddle are canceled by the radially opposite paddle and the axial reaction forces of blade 146 are canceled by the opposing axial reaction forces of the opposing blade 148. In this way, both radial and axial reaction forces are canceled to the degree that all of the blade paddle's resonant frequencies, masses and displacements are matched during operation. To the degree that all reaction forces are not canceled, magnetic core body 164 may be resiliently attached to the product or system to prevent transmission of vibration to the product or system.

Any of a number of blade designs could be used with the fan of FIG. 19, including various shapes and blade mass loading and the specific blades used will be chosen based on the design requirements of a given application.

Clamp-Driven Radial Fan

Figure 20:
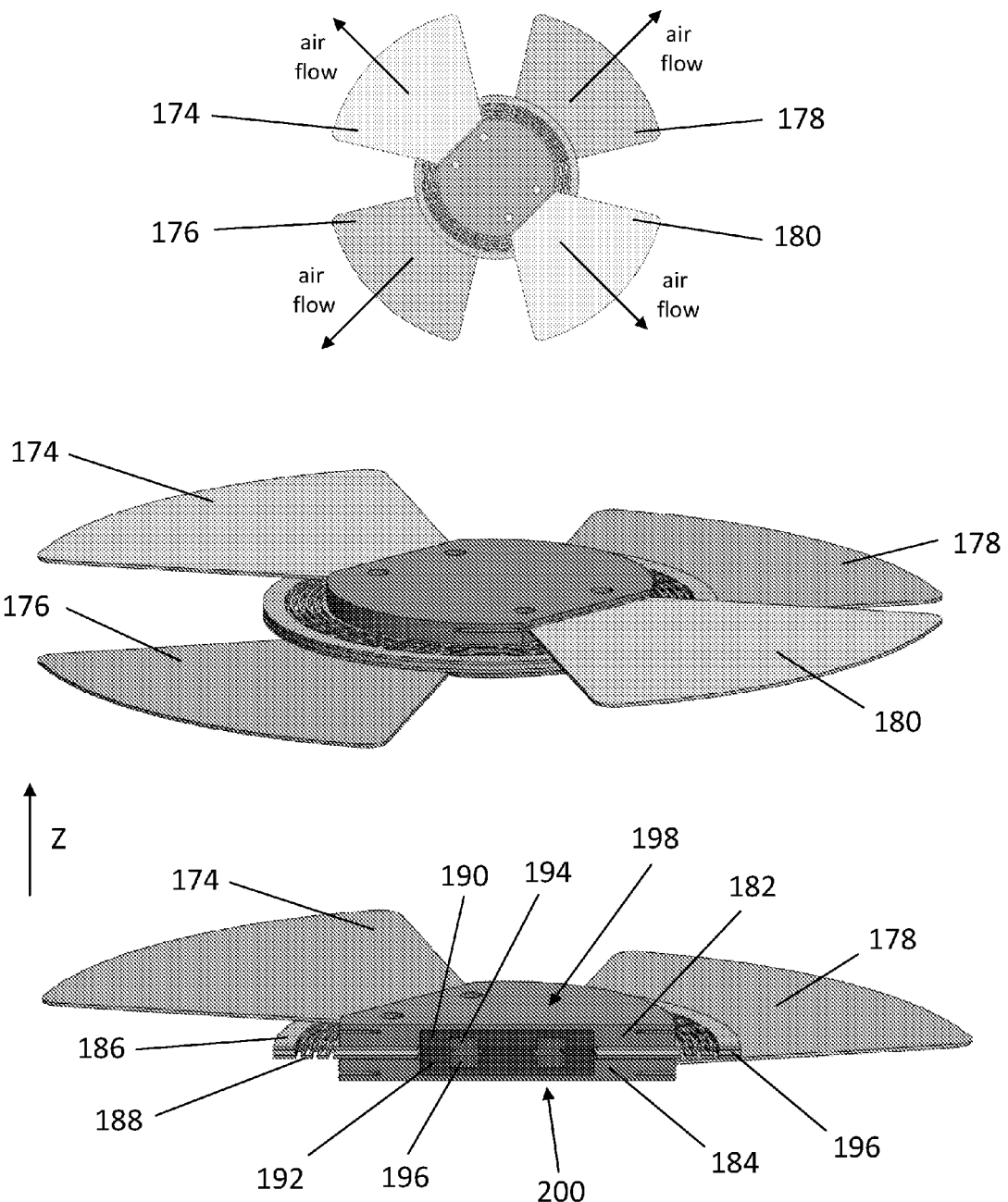
FIG. 20 illustrates a clamp-driven radial fan embodiment.

FIG. 20 illustrates another embodiment that provides radially directed air flow and enhanced vibration cancellation. The radial fan of FIG. 20 comprises a pair of blades 174 and 180 which are clamped into clamp mass 198 and a second pair of blades 176 and 178 which are clamped into clamp mass 200. Clamp mass 198 comprises a clamp disk 182, a magnetic core 190 and a coil 194. Clamp mass 200 comprises a clamp disk 184, a magnetic core 192 and a coil 196. Clamp mass 198 is rigidly bonded to the center of spring 186 and clamp mass 200 is rigidly bonded to the center of spring 188. Springs 186 and 188 are rigidly bonded together at their perimeter by annular spring spacer 196. Springs 186 and 188 allow clamp masses 198 and 200 to oscillate in the axial Z direction. The stiffness of springs 186 and 188 will be chosen such that the energy stored in them, during the application of the magnetic force, will push the clamp masses apart again in a time period appropriate for the operating frequency. To operate primarily in a clamp driven mode where the displacement ratio of blade tip to clamp mass is very high, springs 186 and 188 should be stiff enough to permit only small displacements of clamp masses 198 and 200.

In operation, the blades 174, 176, 178 and 180 oscillate in the Z direction which creates air flow principally in a radial direction. In the preferred embodiment for vibration cancellation, coils 194 and 196 are driven with the same periodic current causing clamp mass 198 to be attracted to clamp mass 200 due to the resulting magnetic attractive force between magnetic cores 190 and 192. The periodicity of the current causes the clamp masses to oscillate in opposition to each other at the frequency of the periodic current. If the drive current frequency is equal to or near the cantilever mode of the blades then the oscillation of the clamp masses in turn excites the cantilever mode of all the blades in such a way that blades 174 and 180 oscillate in phase with each other but 180° out of phase with the blades 176 and 178. Each blade tip oscillates with an arc similar to arc 162 in FIG. 19 and as such each blade creates both radial and Z axial reaction forces that act upon the spring spacer 196. Spring spacer 196 is the point of minimum vibration for the fan of FIG. 20 and is point at which the fan would be mounted to a product. Due to the symmetry of the fan blades the radial reaction forces of blade pair 174 and 180 cancel each other, the radial reaction forces of blade pair 176 and 178 cancel each other and the axial reaction forces of blade pair 174 and 180 are canceled by the opposite axial reaction forces of blade pair 176 and 178. In this way, both radial and axial reaction forces are canceled to the degree that all the blade's resonant frequencies, masses and displacements are matched during operation. To the degree that all reaction forces are not canceled, spring spacer 196 may be resiliently attached to the product or system to prevent transmission of vibration to the product or system.

Any of a number of blade designs could be used with the fan of FIG. 20, including various shapes and blade mass loading and the specific blades used will be chosen based on the design requirements of a given application.

Actuator Types

The actuator topologies and operating principles shown in FIGS. 2-20 illustrate specific actuators that may be used in accordance with the present invention. However, there are many other types of actuators having a stationary component with respect to the blade's displacement and many actuator improvements that may be used in accordance with the present invention and will occur to one skilled in the art, all of which are considered to be within the scope of the present invention.

Figure 21:
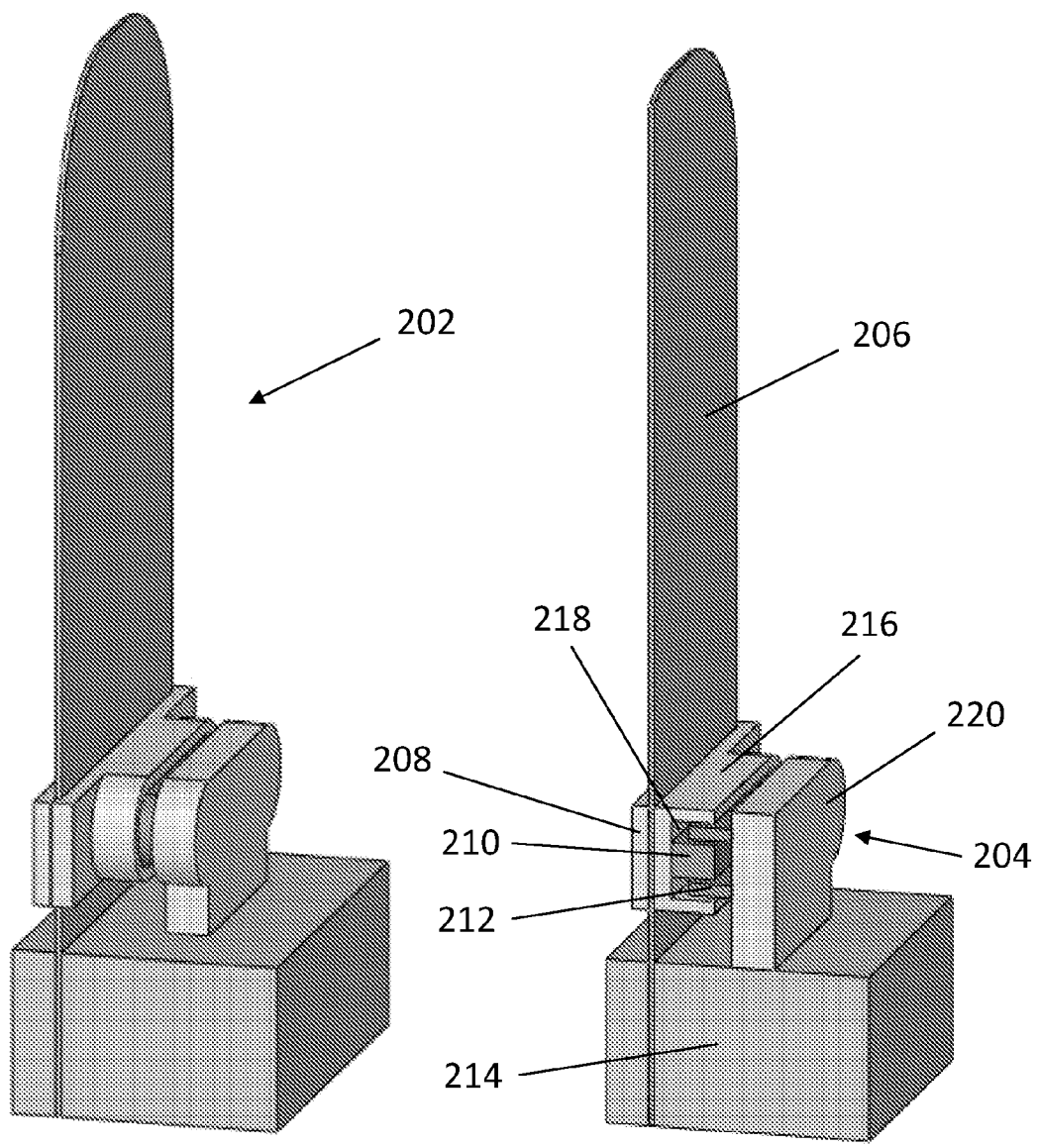
FIG. 21 illustrates a voice coil actuator embodiment.

FIG. 21 illustrates one of many possible actuator examples where a moving-magnet type voice-coil actuator 204 is provided that actuates blade 202. Actuator 204 comprises a magnet holder 216 made of high magnetic permeability material and having a magnet 210 attached thereto such that a magnetic field exists between magnetic holder 216 and magnet 210 in air gap 218. Magnet holder 216 is attached to blade 202 by means of clamp plate 208. Coil 212 is rigidly attached to coil boss 220 with coil boss 220 being rigidly attached to fan base 214. In operation, an alternating current is applied to coil 212 which exerts an alternating force on fan blade 206 via magnet holder 216. If the alternating current frequency is near or equal to the preferred cantilever resonance frequency of blade 206 then blade 206 may oscillate with large tip displacements. A variation on the actuator of FIG. 21 would to reverse the location of magnet and coil to provide a moving-coil actuator.

A further actuator example of a clamp-driven blade actuator is shown in FIG. 22 where cantilever fan blades 222 and 224 are rigidly connected to either side of a block of electrostrictive material 226. In operation, a periodic voltage is applied to the electrostrictive block 226 causing the block to expand and/or contract in the direction illustrated by the double arrow. If the periodic voltage frequency is near or equal to the preferred cantilever resonance frequency of blades 222 and 224, then blades 222 and 224 will oscillate in opposition to each other with large displacements. The electrostrictive material could be for example piezoelectric or magnetostrictive or could comprise a piezo stack (multiple layers of piezoelectric material with intermediate electrodes) to reduce the drive voltage amplitude requirements. The fan of FIG. 22 lends itself well to miniaturization.

Many modifications may be made to the actuators described herein. The actuators shown in FIGS. 2-9, 19 and 20 provide only an attractive force, but may be converted to both attractive and repulsive (push-pull) operation by adding additional actuator components. For example the cantilever fan of FIG. 2 may be converted to push-pull operation by adding another actuator as shown in FIG. 23. An improvement to increase the attractive force between armature 16 and blade 12 of FIG. 2 is to add backing plate 228 to blade 12 as shown in FIG. 24.

Any of the blade-driven or clamp-driven embodiments may be designed to use a wide range of different actuator types and the specific type chosen will typically be based on the requirements of a specific application.

Figure 25:
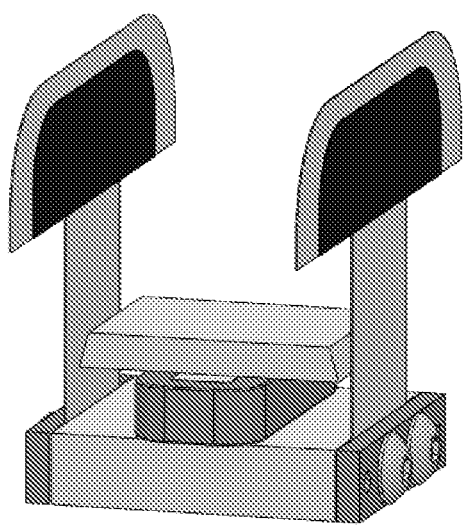
FIG. 25 provides one of many combinations of the subcomponents of the cantilever fan.

While the present invention enables the downsizing of cantilever fans with high air flow rates at low operating frequencies and very long fan life, the scope of the present invention is in no way limited to embodiments provided herein. Various embodiments and enhancements of the present invention are disclosed herein to illustrate the invention's advantages related to cantilever actuation, blade size reduction while maintaining stability of enhanced L/W aspect ratios via blade mass loading, vibration cancellation and vibration reduction and it will occur to those skilled in the art to use many different combinations of these embodiments and enhancements. All of the various combinations of these embodiments will be determined by the requirements of a given application and are considered within the scope of the present invention. For example, FIG. 25 illustrates one of many combinations of blade designs and blade actuation topologies that are possible. Specific combinations of subcomponents of the present invention will be determined by good design practice in response to specific design and end-product requirements.

The embodiments of the present invention may be driven at any frequency within the scope of the present invention. While performance advantages may be provided by operating the fans at drive frequencies that are equal to or close to a given blade's resonance, the scope of the present invention is not limited to the proximity of the drive frequency to the blade's resonance frequency. When drive frequencies are close enough to the blade resonance that energy is stored in the resonance, then blade displacement amplitudes will increase in proportion to the stored energy. The closer the drive frequency is to the instantaneous blade resonance frequency, the greater the stored energy, the greater the blade displacement and the greater the air flow. Operation of the cantilever fan, either with or without stored energy, is considered within the scope of the present invention.

It is also understood that the blades may be made of many different materials such as metals, plastics or elastomers and choice of a specific material will be based on the requirements of a given application.

Many different drive circuits may be used to power the cantilever fan and will be apparent to one skilled in the art and these drive circuits may include resonance locking controls, such as a PLL control, to keep the blades operating at or near their resonant frequencies.

Applications for the fan of the present invention include moving air for heat exchange in thermal management applications for a wide range of hot objects including electronic components such as microprocessors, power electronics components such as MODFETS, HBLEDs and any electronics components needing air cooling as well as secondary heat exchange targets such as heatsinks, printed circuit cards and electronics enclosures. The cantilever fans of the present invention may be used to force air through product platforms such as servers, PC towers, laptops, PDAs or to circulate air within a sealed electronics enclosure such as in cell phones, telecommunications and military applications.

Other applications include general mixing of gases and particulate matter for chemical reactions, fluid metering, sampling, air sampling for bio-warfare agents and general chemical analysis or creating other material changes in suspended particulates such as comminution or agglomeration, or a combination of any of these processes, to name a few.

The foregoing description of some of the embodiments of the present invention have been presented for purposes of illustration and description. In the drawings provided, the subcomponents of individual embodiments provided herein are not necessarily drawn in proportion to each other, for the sake of functional clarity. In an actual product, the relative proportions of the individual components are determined by specific engineering design requirements. The embodiments provided herein are not intended to be exhaustive or to limit the invention to a precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. Although the above description contains many specifications, these should not be construed as limitations on the scope of the invention, but rather as an exemplification of alternative embodiments thereof.

What is claimed is:

1. A cantilever fan, comprising:
   a clamp base arranged to remain stationary, the clamp base having a first side and a second side opposite the first side;
   a first cantilever blade having a stationary end clamped to the first side of the clamp base and a blade tip opposite the stationary end such that the blade tip is free to oscillate relative to the clamp base, the first cantilever blade having a length that extends from the stationary end to the blade tip;
   a second cantilever blade having a stationary end clamped to the second side of the clamp base and a blade tip opposite the stationary end such that the blade tip is free to oscillate relative to the clamp base, the second cantilever blade having a length that extends from the stationary end to the blade tip;
   an actuator having an armature and a coil attached to the clamp base, the armature and coil arranged to remain stationary with the clamp base, the armature extending between the first and second cantilever blades at a location between the stationary end and the blade tip of the first and second cantilever blades such that an air gap is located between the armature and each of the first and second cantilever blades;
   wherein the coil is arranged to create an electromagnetic force in the air gaps between the armature and the first and second cantilever blades so as to apply a periodic force to the first and second cantilever blades and cause periodic deflections of the first and second cantilever blades.

2. The cantilever fan of claim 1 wherein the actuator is configured to apply the periodic force to the first and second cantilever blades and cause periodic deflections of the first and second cantilever blades at a frequency that is equal to a vibrational mode of the first and second cantilever blades.

3. The cantilever fan of claim 1 further comprising: a mass attached to each of the first and second cantilever blades configured to stabilize blade oscillations.

4. The cantilever fan of claim 1 wherein each of the first and second cantilever blades includes at least one leg section and a paddle section with the paddle section being distal to the stationary end and the leg section connecting the paddle section to the stationary end.

5. The cantilever fan of claim 4 further comprising: a mass attached to the paddle section of each of the first and second cantilever blades.

6. The cantilever fan of claim 1, wherein the armature has first and second ends respectively adjacent the first and second cantilever blades, and wherein the first and second ends each have an angled face.

7. The cantilever fan of claim 1, wherein each of the first and second cantilever blades includes a backing plate attached adjacent a respective air gap.

8. The cantilever fan of claim 1, wherein the coil is wound around the armature.

9. The cantilever fan of claim 1, wherein the electromagnetic force in the air gap for each of the first and second cantilever blades pulls each of the first and second cantilever blades toward the armature.

10. The cantilever fan of claim 1, wherein the actuator is arranged to only provide an attractive force on the first and second cantilever blades that pulls the first and second cantilever blades toward each other.

11. The cantilever fan of claim 1, wherein the first and second cantilever blades extend upwardly away from the clamp base.

12. The cantilever fan of claim 11, wherein the armature extends horizontally between the first and second cantilever blades.

13. The cantilever fan of claim 12, wherein the coil is located between the clamp base and the armature.

* * * * *